(12) United States Patent
Shitomi

(10) Patent No.: US 10,418,281 B2
(45) Date of Patent: Sep. 17, 2019

(54) METHOD FOR MANUFACTURING SEMICONDUCTOR DEVICE

(71) Applicant: Mitsubishi Electric Corporation, Tokyo (JP)

(72) Inventor: Takuichiro Shitomi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/095,386

(22) PCT Filed: Jun. 30, 2016

(86) PCT No.: PCT/JP2016/069375
§ 371 (c)(1),
(2) Date: Oct. 22, 2018

(87) PCT Pub. No.: WO2018/003048
PCT Pub. Date: Jan. 4, 2018

(65) Prior Publication Data
US 2019/0131174 A1 May 2, 2019

(51) Int. Cl.
*H01L 21/336* (2006.01)
*H01L 21/8234* (2006.01)
*H01L 27/088* (2006.01)

(52) U.S. Cl.
CPC ........ *H01L 21/8234* (2013.01); *H01L 27/088* (2013.01)

(58) Field of Classification Search
CPC .................................................. H01L 27/088
See application file for complete search history.

(56) References Cited

FOREIGN PATENT DOCUMENTS

| JP | H03-116968 A | 5/1991 |
| JP | H09-064347 A | 3/1997 |
| JP | 2004-296754 A | 10/2004 |
| JP | 2006-310578 A | 11/2006 |
| JP | 2009-158765 A | 7/2009 |

OTHER PUBLICATIONS

International Search Report issued in PCT/JP2016/069375; dated Aug. 2, 2016.

*Primary Examiner* — Samuel A Gebremariam
(74) *Attorney, Agent, or Firm* — Studebaker & Brackett PC

(57) ABSTRACT

An object is to provide a technique for preventing an oxide film from being partly thin. A third oxide film is formed onto a nitride film in a first area; in addition, a fourth oxide film is formed onto a main surface in a second area. The third oxide film, the nitride film, and a first oxide film are removed from the first area using a mask. After the third oxide film, the nitride film, and the first oxide film are removed, a fifth oxide film is formed onto the main surface in the first area. The fifth oxide film is removed from the first area using a mask. After the fifth oxide film is removed, a sixth oxide film is formed onto the main surface in the first area.

5 Claims, 8 Drawing Sheets

METHOD FOR MANUFACTURING SEMICONDUCTOR DEVICE

TECHNICAL FIELD

The present invention relates to a method for manufacturing a semiconductor device.

BACKGROUND ART

A semiconductor device can include semiconductor elements, such as Metal Oxide Semiconductor Field Effect Transistors (MOSFETs), integrated on a single circuit chip, the semiconductor elements with different tolerance of gate voltage, that is, with different gate breakdown voltages. As a wafer processing process for manufacturing such a semiconductor device, a series of steps of forming gate oxide films with different thicknesses onto a single silicon substrate can be applied.

Conventional steps of forming the gate oxide films with different thicknesses onto the single silicon substrate cause a LOCal Oxidation of Silicon (LOCOS) film adjacent to the gate oxide films to have a small thickness, thus affecting transistor properties. To address this problem, proposed is a method of forming a nitride film as a protective film, like techniques in, for instance, Patent Documents 1 to 4.

PRIOR ART DOCUMENTS

Patent Documents

Patent Document 1: Japanese Patent Application Laid-Open No. 3-116968
Patent Document 2: Japanese Patent Application Laid-Open No. 2009-158765
Patent Document 3: Japanese Patent Application Laid-Open No. 2004-296754
Patent Document 4: Japanese Patent Application Laid-Open No. 2006-310578

SUMMARY

Problem to be Solved by the Invention

The inventor has found a problem that using manufacture methods disclosed in, for instance, Patent Documents 1 to 4 to form, onto a single silicon substrate, thin and thick gate oxide films with a large difference in thickness between the films causes the thin gate oxide film to be partly thinner than a desired thickness. The fact that the thin gate oxide film gets partly thinner leads to gate leakage, reduction in gate breakdown voltage, and other problems.

To solve these problems, an object of the present invention is to provide a technique for preventing an oxide film from being partly thin.

Means to Solve the Problem

The present invention provides a method for manufacturing a semiconductor device. The semiconductor device includes a first gate oxide film and a second gate oxide film thicker than the first gate oxide film. The method includes the following: preparing a silicon substrate having a main surface on which a first area and a second area are defined, the silicon substrate including a first oxide film and a second oxide film respectively disposed on the main surface in the first area and on the main surface in the second area; forming a nitride film onto the first oxide film in the first area using a mask; after forming the nitride film, removing the second oxide film from the second area; after removing the second oxide film, forming a third oxide film onto the nitride film in the first area and forming a fourth oxide film onto the main surface in the second area; removing the third oxide film, the nitride film, and the first oxide film from the first area using a mask; after removing the third oxide film, the nitride film, and the first oxide film, forming a fifth oxide film onto the main surface in the first area; removing the fifth oxide film from the first area using a mask; and after removing the fifth oxide film, forming a sixth oxide film onto the main surface in the first area. The first gate oxide film includes the sixth oxide film. The second gate oxide film includes the fourth oxide film.

Effects of the Invention

According to the present invention, the fifth oxide film is formed onto the main surface in the first area after the third oxide film, the nitride film, and the first oxide film are removed; moreover, the fifth oxide film is removed from the first area using the mask; moreover the fifth oxide film is removed, and then the sixth oxide film is formed onto the main surface in the first area. This prevents the oxide film from being partly thin.

These and other objects, features, aspects and advantages of the present invention will become more apparent from the following detailed description of the present invention when taken in conjunction with the accompanying drawings.

DESCRIPTION OF EMBODIMENT(S)

<First Embodiment>

A first embodiment of the present invention provides a method for manufacturing a semiconductor device including a thin gate oxide film and a thick gate oxide film that is thicker than the thin gate oxide film. First and second related manufacture methods will be firstly described, followed by the method for manufacturing the semiconductor device according to the first embodiment. The first and second related manufacture methods are first and second manufacture methods relating to the method according to the first embodiment.

FIGS. 1 to 5 are cross-sectional views of the configuration of a semiconductor device for describing steps in the first related manufacture method.

Figure 1:
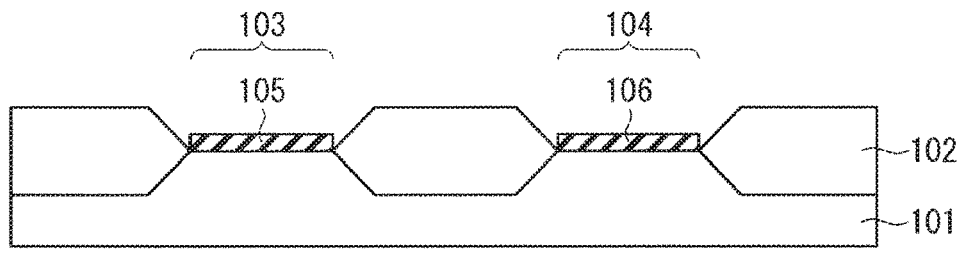
FIG. 1 is a cross-sectional view for describing a step in a first related manufacture method.

First, a silicon substrate 101 as illustrated in FIG. 1 is prepared. The silicon substrate 101 has a main surface on which a LOCOS 102, a film for element isolation, is selectively formed. The main surface of the silicon substrate 101 has areas with no LOCOS 102. These areas are used element formation areas isolated by the LOCOS 102, and are called active areas. Formed in such an area for element formation is a semiconductor element including a semiconductor transistor, such as a MOSFET. Hereinafter, the main surface of the silicon substrate 101 will be referred to, in abbreviated form, as a "substrate main surface".

Figure 5:
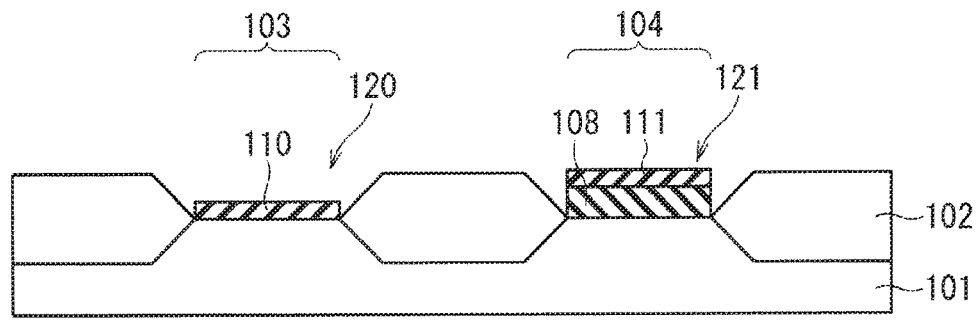
FIG. 5 is a cross-sectional view for describing a step in the first related manufacture method.

A low-voltage active area 103 is an active area in which a relatively low voltage is applied to a gate electrode, and in which a thin gate oxide film 120 is formed as illustrated in FIG. 5. A high-voltage active area 104 is an active area in which a relatively high voltage is applied to the gate electrode, and in which a thick gate oxide film 121 thicker than the thin gate oxide film 120 is formed. It is noted that each oxide film, although in the following description being formed through oxidation, such as thermal oxidation, may be formed through any method.

Referring back to FIG. 1, an underlay oxide film 105 and an underlay oxide film 106 are respectively formed on the substrate main surface in the low-voltage active area 103 and on the substrate main surface in the high-voltage active area 104. The underlay oxide films 105 and 106 are oxide films for a base under the underlay oxide films 105 and 106 to suffer less damage resulting from ion implantation.

Figure 2:
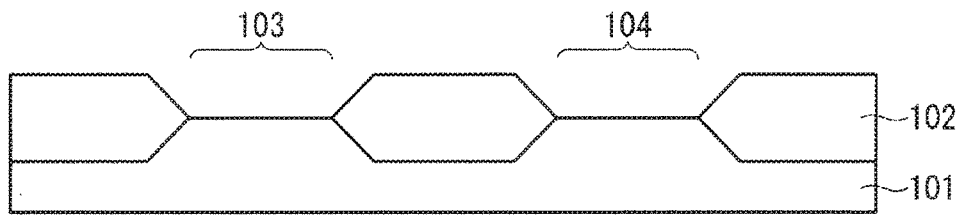
FIG. 2 is a cross-sectional view for describing a step in the first related manufacture method.

After the silicon substrate 101 as illustrated in FIG. 1 is prepared, the underlay oxide films 105 and 106 are removed from the low-voltage active area 103 and the high-voltage active area 104 through wet etching, as illustrated in FIG. 2.

Figure 3:
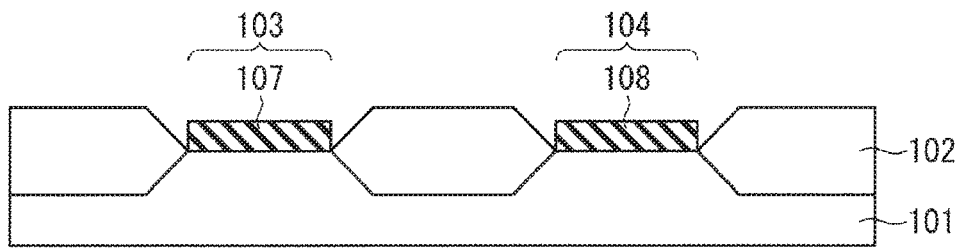
FIG. 3 is a cross-sectional view for describing a step in the first related manufacture method.

Then, as illustrated in FIG. 3, an oxide film 107 that is relatively thick is formed onto the substrate main surface in the low-voltage active area 103; moreover an oxide film 108 that is relatively thick is formed onto the substrate main surface in the high-voltage active area 104. At this time, an oxide film, which is not shown, may be formed also onto the LOCOS 102. This applies to oxide-film formation steps, which will be described below.

Figure 4:
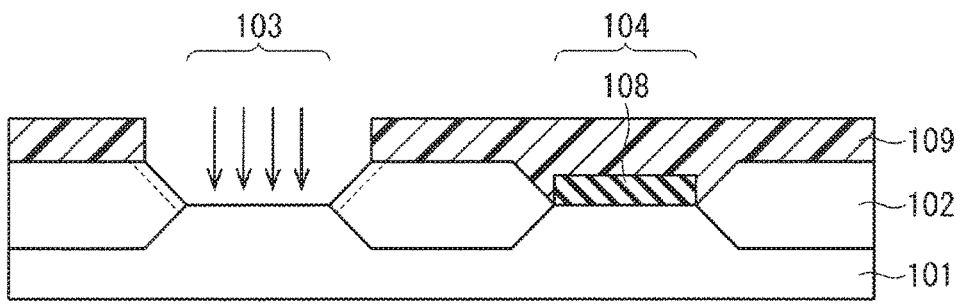
FIG. 4 is a cross-sectional view for describing a step in the first related manufacture method.

Next, as illustrated in FIG. 4, a resist 109 is applied onto the silicon substrate 101, followed by exposure to light and development, to thus form an opening in which an area including the low-voltage active area 103 is exposed. Then, the oxide film 107 is removed from the low-voltage active area 103 through wet etching using the formed resist 109 as a mask.

Then, as illustrated in FIG. 5, the resist 109 is removed, followed by forming an oxide film 110 that is relatively thin onto the substrate main surface in the low-voltage active area 103, and forming an oxide film 111 that is relatively thin onto the substrate main surface in the high-voltage active area 104. Through these steps, the thin gate oxide film 120 including the oxide film 110 is formed in the low-voltage active area 103; in addition, the thick gate oxide film 121 including the oxide films 108 and 111 is formed in the high-voltage active area 104. In the step in FIG. 3, the oxide film 108 is formed with a thickness that reflects the addition of the oxide film 111 to the oxide film 108 so that the thick gate oxide film 121 has a desired thickness. In this case, the oxide film 108 is formed more thinly than a desired thickness.

The first related manufacture method enables semiconductor device fabrication through simple and relatively fewer steps. Hereinafter, the first related manufacture method will be also referred to as a "resist mask flow".

This resist mask flow includes setting an opening area of the resist 109 to be wider than the low-voltage active area 103 so that the oxide film 107 in FIG. 3 is completely removed in the step in FIG. 4. In other words, the opening area of the resist 109 is set to reach the edge of the LOCOS 102 so that the oxide film 107 is removed for certain.

In view of manufacture variations, the step in FIG. 4 typically includes setting a greater etching degree than a predicted etching degree to which the oxide film 107 is removed. Additional etching is called over-etching. Established is the following equation: (an over-etch degree)

equals (an etching degree that is set) minus (a predicted etching degree to which the oxide film 107 is removed).

In the resist mask flow, the use of the opening area and the over-etching removes the oxide film 107 for certain. The use of the opening area and the over-etching, however, partly etches the edge of the LOCOS 102 adjacent to the low-voltage active area 103, thereby causing film loss and retrogression as indicated by a dotted line in FIG. 4. The film loss and retrogression in the LOCOS 102 changes element properties, increases variations of element properties, and by extension, reduces an isolation breakdown voltage.

In particular, a large difference in thickness between the thin gate oxide film 120 and the thick gate oxide film 121 causes serious film loss in the LOCOS 102. For wet etching, an over-etch degree is commonly determined by the thickness of a film to be etched and an etching rate. Accordingly, the thicker the oxide film 107 is, the larger an absolute degree of over-etching is, that is, the larger an absolute degree of film loss in the LOCOS 102 is. Moreover, the thinner the oxide film 111 is, the finer transistor is formed in the low-voltage active area 103 in accordance with the scaling law of a transistor. This means that change degrees in the dimension of an element area and variations of the element area, due to the film loss in the LOCOS 102, and other factors have greater effect on transistor properties.

The second related manufacture method describes below, in contrast, prevents the film loss in the LOCOS 102, which occurs in the first related manufacture method, i.e., the resist mask flow.

FIGS. 6 to 11 are cross-sectional views of the configuration of a semiconductor device for describing steps in the second related manufacture method. Hereinafter, identical or similar components between the second related manufacture method and the first related manufacture method are denoted by the same reference signs. Mainly described are components different between these methods.

Figure 6:
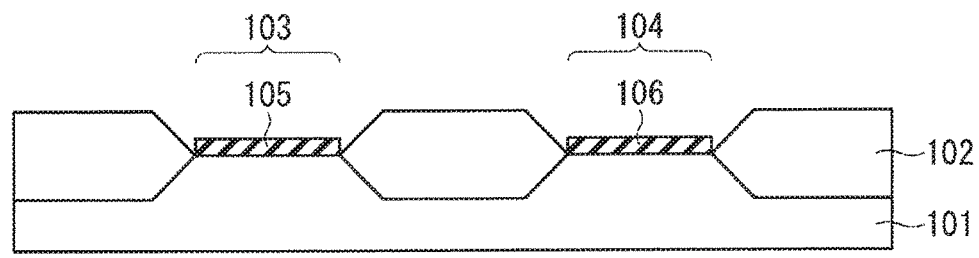
FIG. 6 is a cross-sectional view for describing a step in a second related manufacture method.

As illustrated in FIG. 6, like FIG. 1, prepared is the silicon substrate 101 with the underlay oxide film 105 and the underlay oxide film 106 respectively formed on the substrate main surface in the low-voltage active area 103 and on the substrate main surface in the high-voltage active area 104. A first area according to the present invention can be referred to as the low-voltage active area 103 in FIG. 6. Further, a second area according to the present invention can be referred to as the high-voltage active area 104 in FIG. 6. Still further, a first oxide film according to the present invention can be referred to as the underlay oxide film 105 in FIG. 6. Yet further, a second oxide film according to the present invention can be referred to as the underlay oxide film 106 in FIG. 6.

Figure 7:
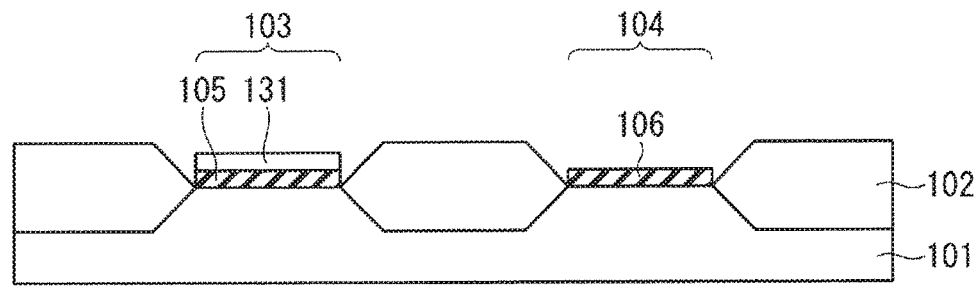
FIG. 7 is a cross-sectional view for describing a step in the second related manufacture method.

After the silicon substrate 101 is prepared as illustrated in FIG. 6, a mask (not shown), such as a resist, is formed through photolithography. Then, as illustrated in FIG. 7, a nitride film cover 131 serving as a protective film is formed onto the underlay oxide film 105 in the low-voltage active area 103. A nitride film according to the present invention can be referred to as the nitride film cover 131 in FIG. 7.

Figure 8:
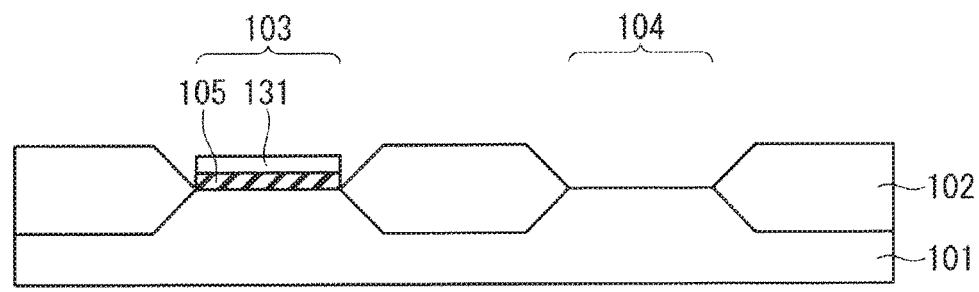
FIG. 8 is a cross-sectional view for describing a step in the second related manufacture method.

Then, as illustrated in FIG. 8, the underlay oxide film 106 is removed from high-voltage active area 104 through wet etching.

Figure 9:
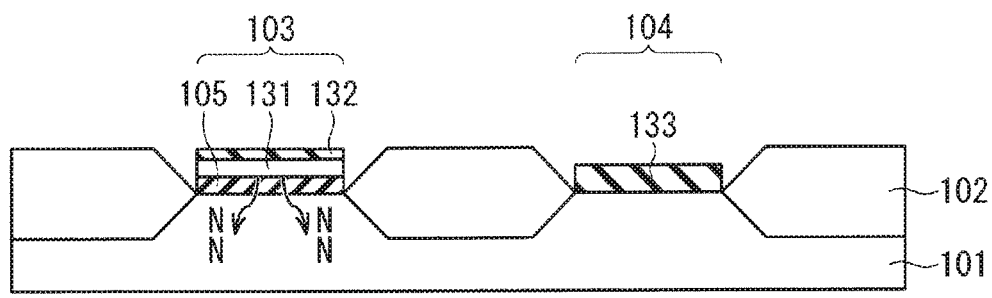
FIG. 9 is a cross-sectional view for describing a step in the second related manufacture method.

Subsequently, as illustrated in FIG. 9, an oxide film 132 is formed onto the nitride film cover 131 in the low-voltage active area 103; in addition, an oxide film 133 is formed onto the substrate main surface in the high-voltage active area 104. A third oxide film according to the present invention can be referred to as the oxide film 132 in FIG. 9. Further, a fourth oxide film according to the present invention can be referred to as the oxide film 133 in FIG. 9.

Here, a typical oxide film is difficult to form onto a nitride film. For this reason, although the oxide film 132 and the oxide film 133 are simultaneously formed under almost the same condition, the oxide film 132 on the nitride film cover 131 in the low-voltage active area 103 is formed relatively thinly, whereas the oxide film 133 on the substrate main surface in the high-voltage active area 104 is formed relatively thickly.

Figure 10:
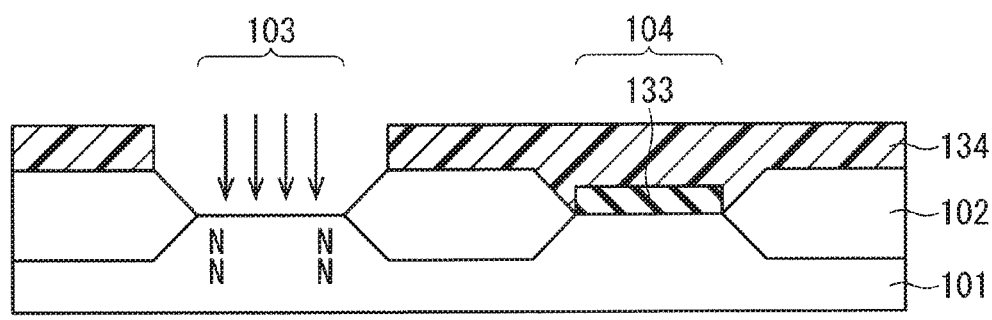
FIG. 10 is a cross-sectional view for describing a step in the second related manufacture method.

Next, as illustrated in FIG. 10, a resist 134 is applied onto the silicon substrate 101, followed by exposure to light and development, to thus form an opening in which an area including the low-voltage active area 103 is exposed. Then, the oxide film 132 and the nitride film cover 131 are removed from the low-voltage active area 103 through dry etching using the formed resist 134 as a mask, followed by removing the underlay oxide film 105 from the low-voltage active area 103 through wet etching.

Figure 11:
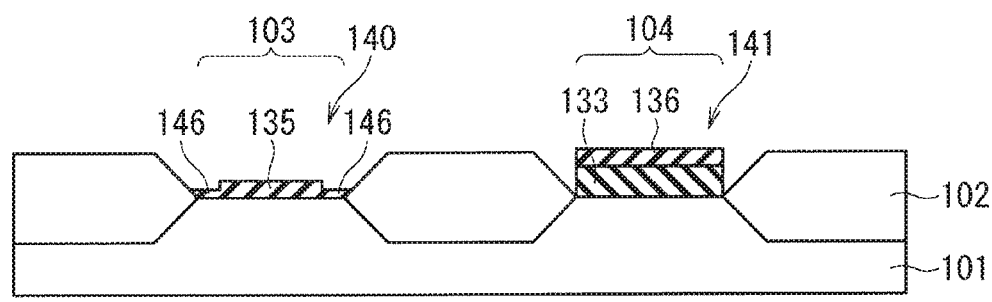
FIG. 11 is a cross-sectional describing a step in the second related manufacture method.

Subsequently, as illustrated in FIG. 11, the resist 134 is removed; then an oxide film 135 that is relatively thin is formed onto the substrate main surface in the low-voltage active area 103 through oxidation, and an oxide film 136 that is relatively thin is formed onto the oxide film 133 in the high-voltage active area 104 through oxidation. Accordingly, formed in the low-voltage active area 103 is a thin gate oxide film 140 including the oxide film 135. In addition, formed in the high-voltage active area 104 is a thick gate oxide film 141 including the oxide films 133 and 136.

In the second related manufacture method, a target to be over-etched through wet etching in FIG. 10 is only the underlay oxide film 105 that is relatively thin. This reduces the over-etch degree, thereby preventing the film loss in the LOCOS 102 near the low-voltage active area 103.

Nevertheless, the inventor has found a problem that applying the second related manufacture method to a semiconductor device with a large difference in thickness between the thin gate oxide film 140 and the thick gate oxide film 141, causes the thin gate oxide film 140 to be partly thinner than a desired thickness. Hereinafter, part of the thin gate oxide film 140 that is thinner than a desired thickness is referred to as a thin film portion 146.

The thin film portion 146 is located near the edge of the LOCOS 102 in an area where the thin gate oxide film 140 is formed. Accordingly, nitrogen (N) that has diffused from the nitride film cover 131 throughout the silicon substrate 101 in the step of forming the oxide film 133 in FIG. 9 is presumably trapped in a defect resulting from, for instance, stress near the edge of the LOCOS 102, thus causing a phenomenon of hindering oxidation (called a white ribbon mode) in the subsequent step of forming the oxide film 135 in FIG. 11.

The thicker the thick gate oxide film 141 is, that is, the thicker the oxide film 133 is, the more nitrogen diffuses from the nitride film cover 131 throughout the silicon substrate 101. This hinders, to a greater degree, oxidation for forming the oxide film 135 included in the thin gate oxide film 140. Moreover, the thinner the thin gate oxide film 140 is, the more noticeable problems the thin film portion 146 causes, such as gate leakage and reduction in gate breakdown voltage. As such, a greater difference in thickness between the gate oxide films tends to produce the thin film portion 146. The thin film portion 146 leads to degradations in semiconductor device properties, such as the gate leakage and the reduction in gate breakdown voltage.

Figure 12:
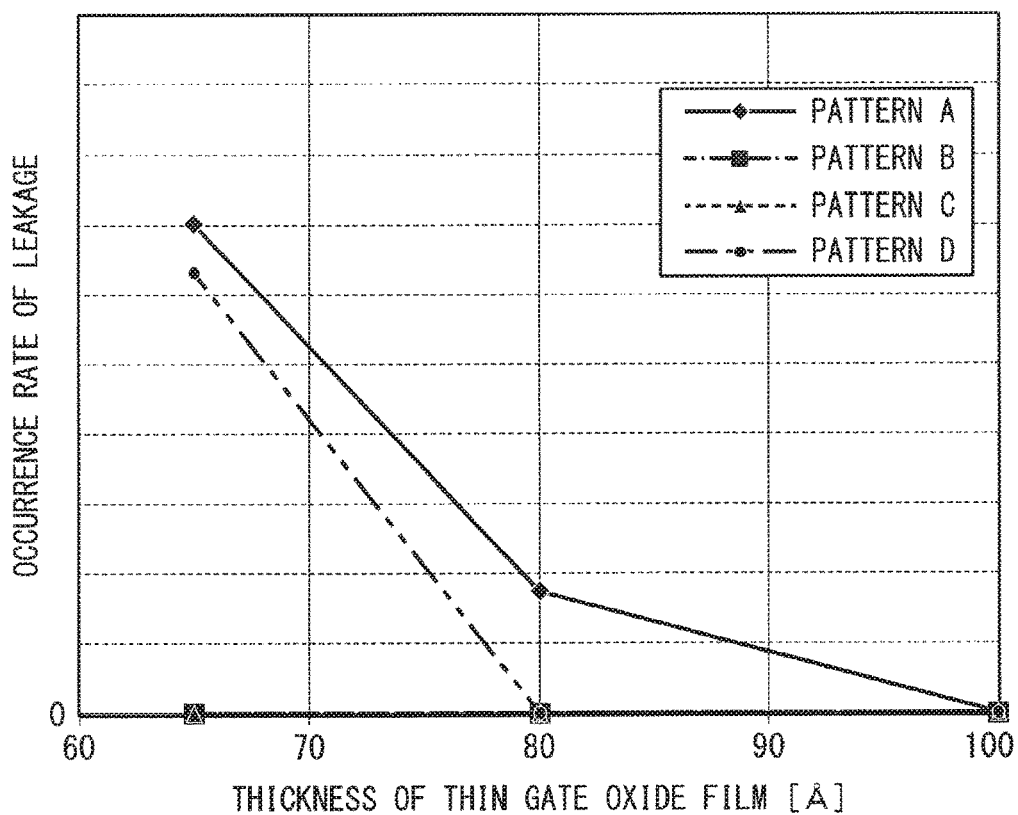
FIG. 12 shows the relationship between the occurrence rate of gate leakage and the thickness of a thin gate oxide film.

FIG. 12 shows the relationship between the occurrence rate of gate leakage and the thickness of the thin gate oxide film 140 when the thick gate oxide film 141 has a uniform thickness of 800 Å. As shown in FIG. 12, the probability of gate leakage occurrence is high as the thickness of the thin gate oxide film 140 becomes smaller than 100 Å, that is, as the difference in thickness between the gate oxide films becomes large, thus concluding that the thin film portion 146 has a great effect.

To prevent the thin film portion 146, the LOCOS 102 can undergo intentional film loss, thereby forming a gate oxide film onto a silicon inclined surface. However, such intentional film loss in the LOCOS 102 is inconsistent with an object of adding the nitride film cover 131.

Alternatively, sacrificial oxidation can be added before the formation of the thin gate oxide film 140. However, mere addition of the sacrificial oxidation, which prevents the thin film portion 146 but increases the film loss in the LOCOS 102, spoils advantages obtained by adding the nitride film cover 131.

To address this, the inventor has discovered a technique for reducing these deficiencies and preventing gate leakage and reduction in gate breakdown voltage by appropriately setting the thickness of a sacrificial oxide film. The following details a manufacture method according to the first embodiment, the method providing such achievements.

Figure 13:
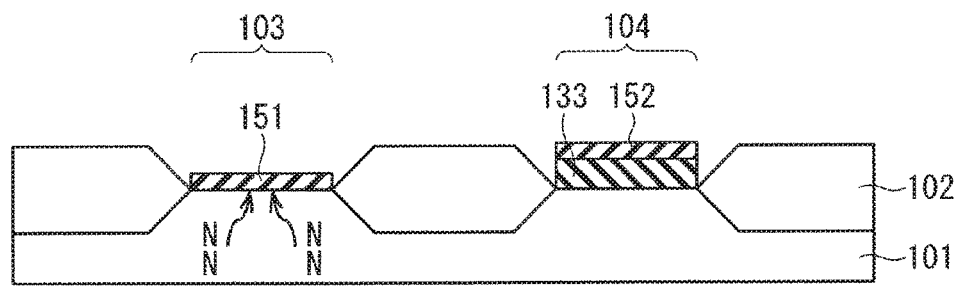
FIG. 13 is a cross-sectional view for describing a step in a method for manufacturing a semiconductor device according to a first embodiment.
Figure 14:
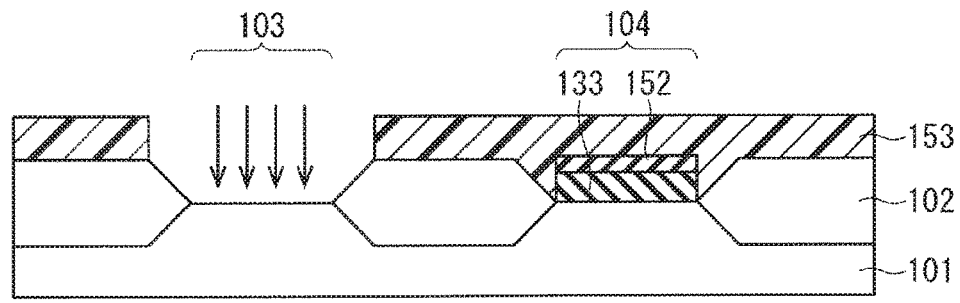
FIG. 14 is a cross-sectional view for describing a step in the method for manufacturing the semiconductor device according to the first embodiment.
Figure 15:
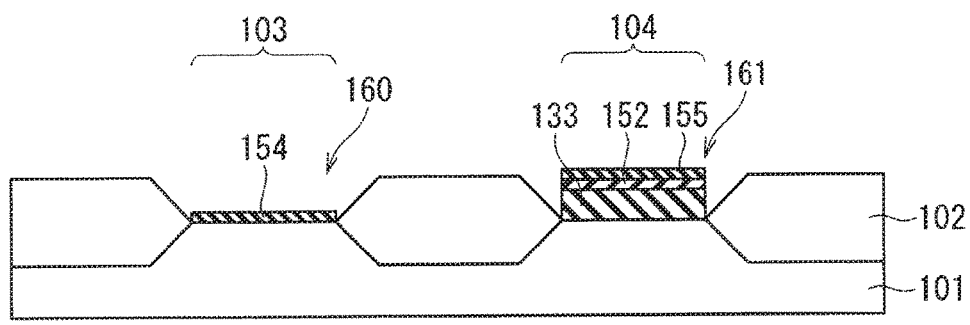
FIG. 15 is a cross-sectional view for describing a step in the method for manufacturing the semiconductor device according to the first embodiment.

FIGS. 13 to 15 are cross-sectional views of the configuration of a semiconductor device for describing steps in the manufacture method according to the first embodiment. Identical or similar components between the manufacture method according to the first embodiment and the first and second related manufacture methods are denoted by the same reference signs. Mainly described are components different between these methods.

First, preformed are the same steps as the steps in FIGS. 6 to 10 included in the second related manufacture method. After the step in FIG. 10, as illustrated in FIG. 13, a sacrificial oxide film 151 is formed onto the substrate main surface in the low-voltage active area 103 through oxidation; in addition, an oxide film 152 is formed onto the oxide film 133 in the high-voltage active area 104 through oxidation. A fifth oxide film according to the present invention can be referred to as the sacrificial oxide film 151 in FIG. 13. Further, a seventh oxide film according to the present invention can be referred to as the oxide film 152 in FIG. 13.

Next, as illustrated in FIG. 14, a resist 153 is applied onto the silicon substrate 101, followed by exposure to light and development, to thus form an opening in which an area including the low-voltage active area 103 is exposed. Then, the sacrificial oxide film 151 is removed from the low-voltage active area 103 through wet etching using the formed resist 153 as a mask.

Then, as illustrated in FIG. 15, the resist 153 is removed, followed by forming an oxide film 154 that is relatively thin onto the substrate main surface in the low-voltage active area 103, and forming an oxide film 155 that is relatively thin onto the oxide film 152 in the high-voltage active area 104. A sixth oxide film according to the present invention can be referred to as the oxide film 154 in FIG. 15. Further, an eighth oxide film according to the present invention can be referred to as the oxide film 155 in FIG. 15.

Through these steps, formed in the low-voltage active area 103 is a thin gate oxide film 160 including the oxide film 154. In addition, formed in the high-voltage active area 104 is a thick gate oxide film 161 that is thicker than the thin gate oxide film 160 and includes the oxide films 133, 152, and 155. Here, a first gate oxide film according to the present invention can be referred to as the thin gate oxide film 160 in FIG. 15. Further, a second gate oxide film according to the present invention can be referred to as the thick gate oxide film 161 in FIG. 15.

In the step in FIG. 9, the oxide film 133 is formed with a thickness that reflects the addition of the oxide films 152 and 155 to the oxide film 133 so that the thick gate oxide film 161 has a desired thickness. In this case, the oxide film 133 is formed more thinly than a desired thickness.

<Gist of First Embodiment>

In the manufacture method according to the first embodiment, a target to be over-etched through wet etching is only the underlay oxide film 105, which is relatively thin, and the sacrificial oxide film 151. Consequently, this manufacture method achieves a more reduced over-etch degree than the resist mask flow, which removes the relatively thick oxide film 107 in FIG. 3, thereby preventing the film loss in the LOCOS 102 near the low-voltage active area 103. Moreover, nitrogen (N), although diffusing from the nitride film cover 131 throughout the silicon substrate 101 at the time of forming the relatively thick oxide film 133 in FIG. 9, is taken into the sacrificial oxide film 151 at the time of forming the sacrificial oxide film 151. This prevents oxidation hindrance at the time of forming the oxide film 154, constituting the thin gate oxide film 160, thereby preventing the thin film portion 146 in FIG. 11.

Figure 16:
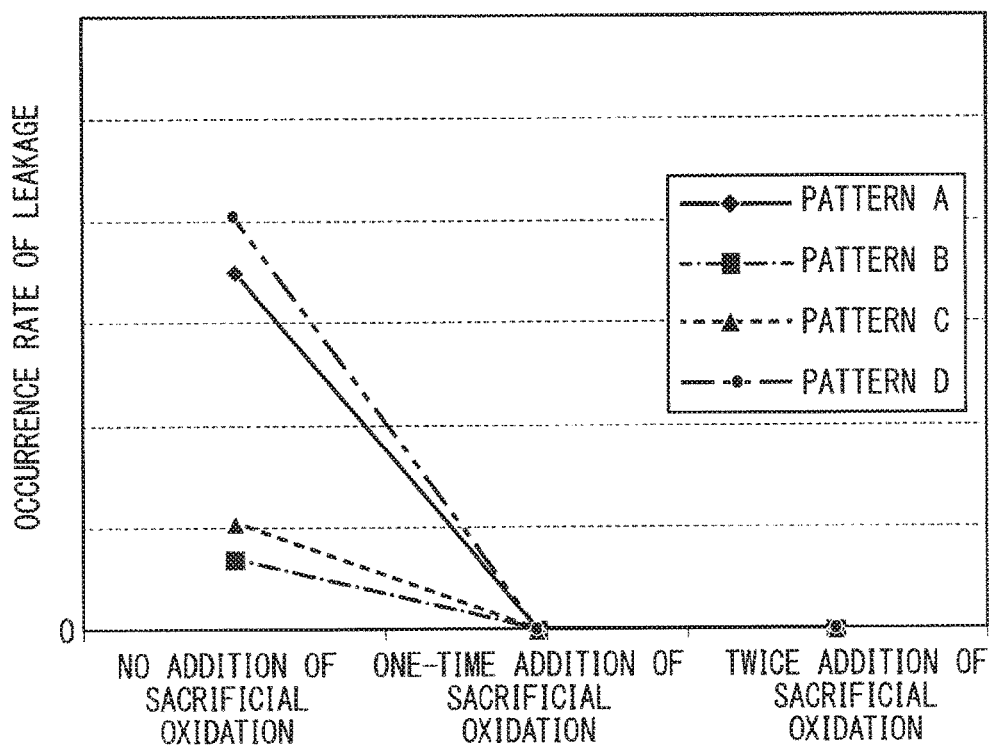
FIG. 16 shows the relationship between the number of sacrificial oxidation processes and the occurrence rate of gate leakage.

FIG. 16 shows the relationship between the number of sacrificial oxidation processes forming the sacrificial oxide film 151 and the occurrence rate of gate leakage when the manufacture method according to the first embodiment is used. FIG. 16 reveals the fact that the addition of sacrificial oxidation prevents the thin film portion 146 in FIG. 11, the loss in the LOCOS 102, and by extension, gate leakage. This fact is effective particularly in a large difference in thickness between the gate oxide films, for instance, when the thickness of the thin gate oxide film 160 is smaller than 100 Å.

Figure 17:
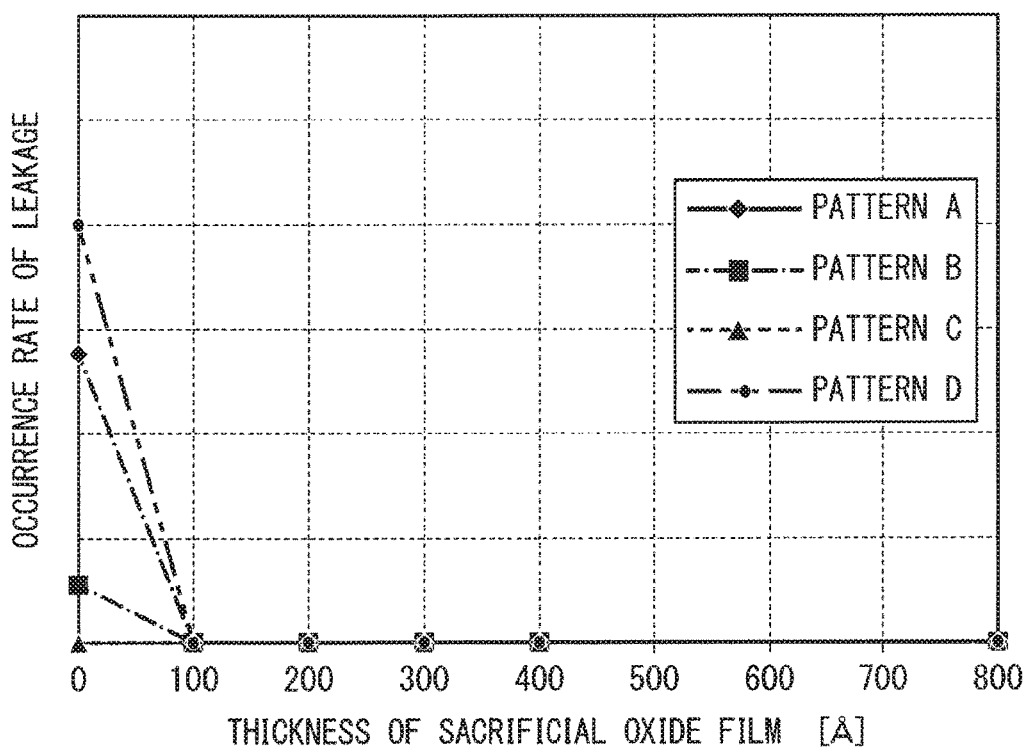
FIG. 17 shows the relationship between the thickness of a sacrificial oxide film and the occurrence rate of gate leakage.

FIG. 17 shows the relationship between the thickness of the sacrificial oxide film 151 and the occurrence rate of gate leakage when the manufacture method according to the first embodiment is used. FIG. 17 reveals that a sacrificial oxide film having a thickness of 100 Å or more prevents the thin film portion 146 in FIG. 11, the loss in the LOCOS 102, and by extension, gate leakage. For this reason, the thickness of the sacrificial oxide film 151 is preferably 100 Å or more, and is preferably 150 Å or more in view of manufacture variations.

<Modification>

In the manufacture method according to the first embodiment, sacrificial oxidation is added in an isolated structure provided with the LOCOS 102. Sacrificial oxidation may be added in an isolated structure provided with a Shallow Trench Isolation (STI) structure instead of the LOCOS 102. Then, this prevents the STI structure from having a rounded edge due to its retrogression, thereby improving an insulation breakdown voltage.

Figure 18:
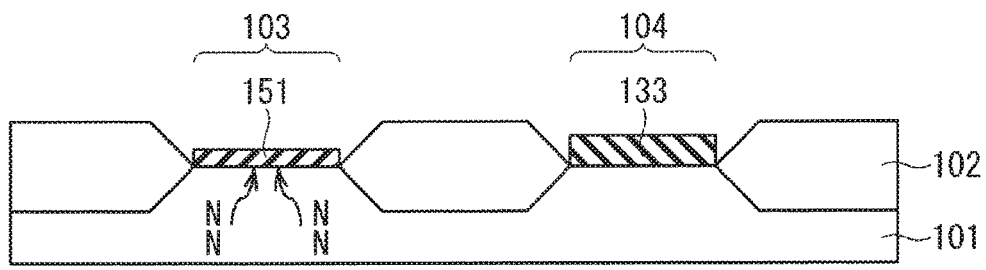
FIG. 18 is a cross-sectional view for describing a step in a method for manufacturing a semiconductor device according to a modification.
Figure 19:
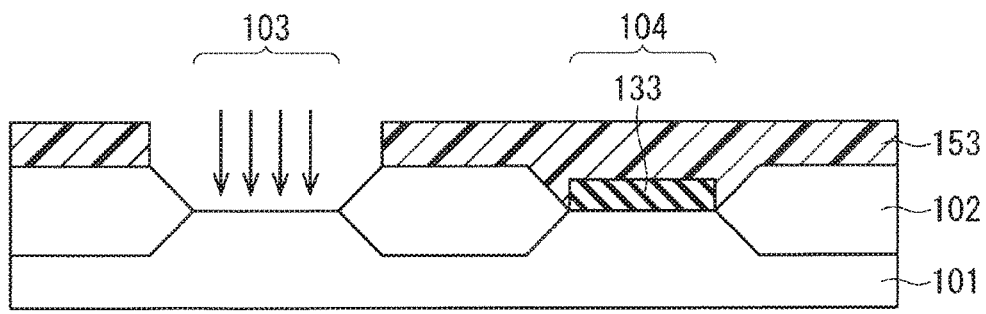
FIG. 19 is a cross-sectional view for describing a step in the method for manufacturing the semiconductor device according to the modification.
Figure 20:
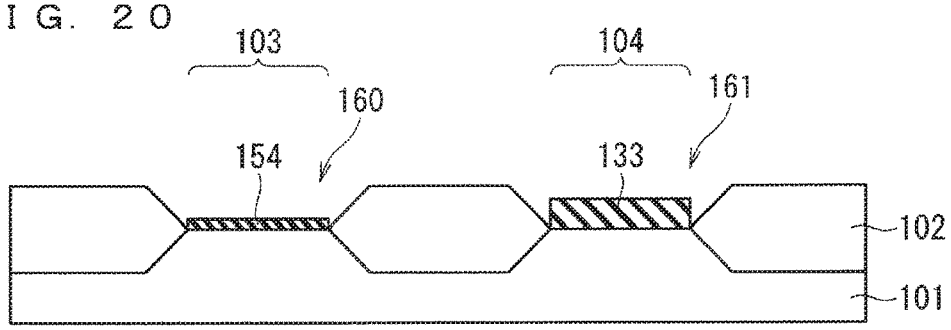
FIG. 20 is a cross-sectional view for describing a step in the method for manufacturing the semiconductor device according to the modification.

In the first embodiment, the sacrificial oxide film 151 is formed along with the oxide film 152 in the step in FIG. 13; moreover, the oxide film 154 is formed along with the oxide film 155 in the step in FIG. 15. As illustrated in FIGS. 18 to 20, the sacrificial oxide film 151 may be formed using a mask, which is not shown, without forming the oxide film 152, or the oxide film 154 may be formed using a mask, which is not shown, without forming the oxide film 155. In this case, the thick gate oxide film 161 includes the oxide film 133, but does not include any of the oxide films 152 and 155. In this case, in the step in FIG. 9, the oxide film 133 is formed so as to have a thickness equal to a desired thickness.

<Second Embodiment>

A manufacture method according to a second embodiment of the present invention prevents the thin film portion 146, and by extension, gate leakage using an aspect different from that of the manufacture method according to the first embodiment.

FIGS. 21 to 25 are cross-sectional views of the configuration of a semiconductor device for describing steps in the manufacture method according to the second embodiment. Identical or similar components between the manufacture method according to the second embodiment and the aforementioned manufacture methods are denoted by the same reference signs. Mainly described are components different between these methods.

First, like FIG. 6, prepared is the silicon substrate 101 with the underlay oxide film 105 and the underlay oxide film 106 respectively formed on the substrate main surface in the low-voltage active area 103 and on the substrate main surface in the high-voltage active area 104.

Figure 21:
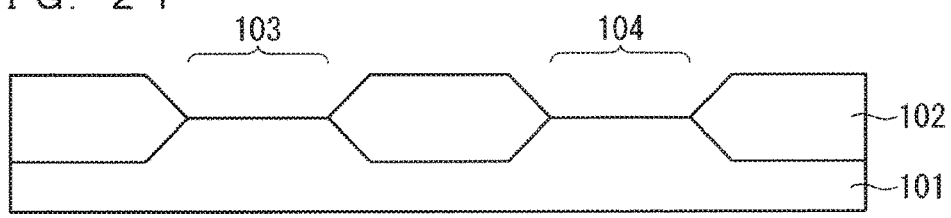
FIG. 21 is a cross-sectional view for describing a step in a method for manufacturing a semiconductor device according to a second embodiment.

Then, as illustrated in FIG. 21, the underlay oxide film 105 and the underlay oxide film 106 are respectively removed from the low-voltage active area 103 and the high-voltage active area 104 through wet etching.

Figure 22:
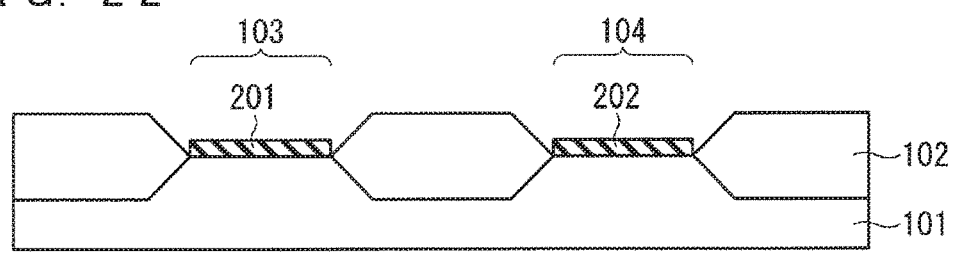
FIG. 22 is a cross-sectional view for describing a step in the method for manufacturing the semiconductor device according to the second embodiment.

Next, as illustrated in FIG. 22, an oxide film 201 that is relatively thin is formed onto the substrate main surface in the low-voltage active area 103; in addition, an oxide film 202 that is relatively thin is formed onto the substrate main surface in the high-voltage active area 104.

Figure 23:
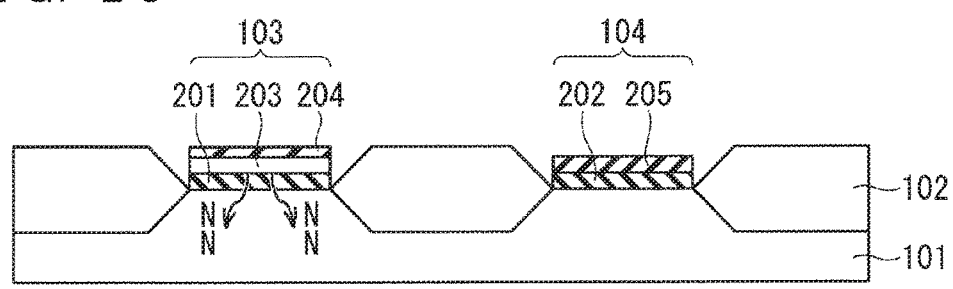
FIG. 23 is a cross-sectional view for describing a step in the method for manufacturing the semiconductor device according to the second embodiment.

Subsequently, a mask (not shown), such as a resist, is formed through, for instance, photolithography. Then, as illustrated in FIG. 23, a nitride film cover 203 is formed onto the oxide film 201 in the low-voltage active area 103. Then, as illustrated in FIG. 23, an oxide film 204 is formed onto the nitride film cover 203 in the low-voltage active area 103; in addition, an oxide film 205 is formed onto the oxide film 202 in the high-voltage active area 104. Here, an oxide film is difficult to form onto a nitride film; hence, the oxide film 204 is thinner than the oxide film 205.

Figure 24:
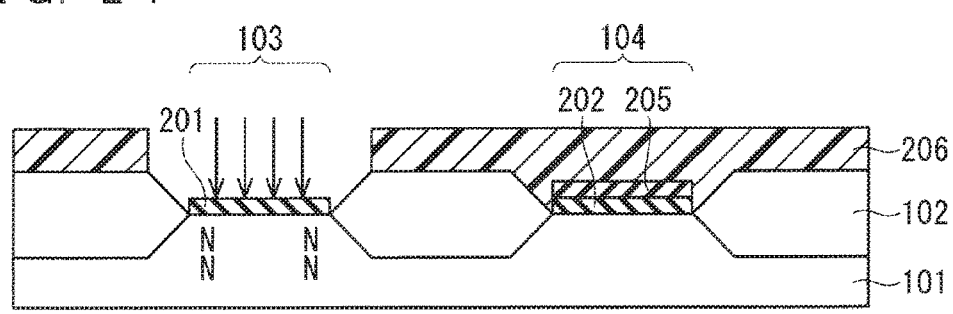
FIG. 24 is a cross-sectional view for describing a step in the method for manufacturing the semiconductor device according to the second embodiment.

Next, as illustrated in FIG. 24, a resist 206 is applied onto the silicon substrate 101, followed by exposure to light and development, to thus form an opening in which an area including the low-voltage active area 103 is exposed. Then, the oxide film 204 and the nitride film cover 203 are removed from low-voltage active area 103 through dry etching using the formed resist 206 as a mask, but the oxide film 201 remains unremoved.

Figure 25:
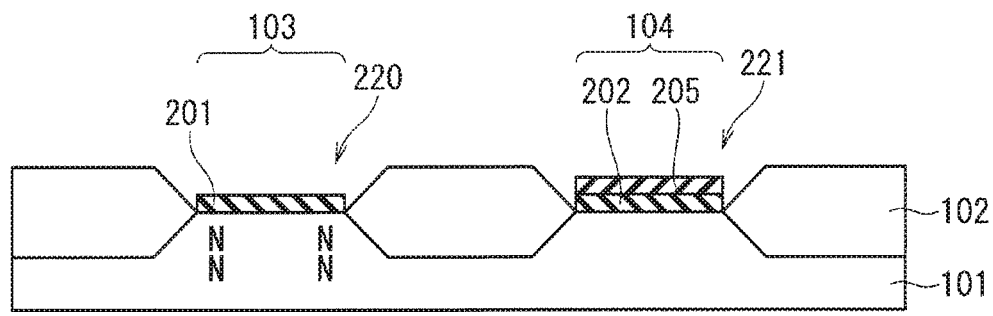
FIG. 25 is a cross-sectional view for describing a step in the method for manufacturing the semiconductor device according to the second embodiment.

Subsequently, as illustrated in FIG. 25, the resist 206 is removed. Through these steps, formed in the low-voltage active area 103 is a thin gate oxide film 220 including the oxide film 201; in addition, formed in the high-voltage active area 104 is a thick gate oxide film 221 including the oxide films 202 and 205.

<Gist of Second Embodiment>

In the manufacture method according to the second embodiment, a target to be over-etched through wet etching is only the underlay oxide film 105, which is relatively thin. Consequently, this manufacture method achieves a more reduced over-etch degree than the resist mask flow, which removes the relatively thick oxide film 107 in FIG. 3, thereby preventing the film loss in the LOCOS 102 near the low-voltage active area 103. Further, nitrogen (N) diffuses from the nitride film cover 203 throughout the silicon substrate 101 at the time of forming the oxide film 205 in FIG. 23. However, the oxide film 201, constituting the thin gate oxide film 220, has already been formed at this time, thus preventing the thin film portion 146 in FIG. 11.

<Third Embodiment>

A manufacture method according to a third embodiment of the present invention prevents the thin film portion 146, and by extension, gate leakage using an aspect different from that of the manufacture method according to the first embodiment.

Figure 26:
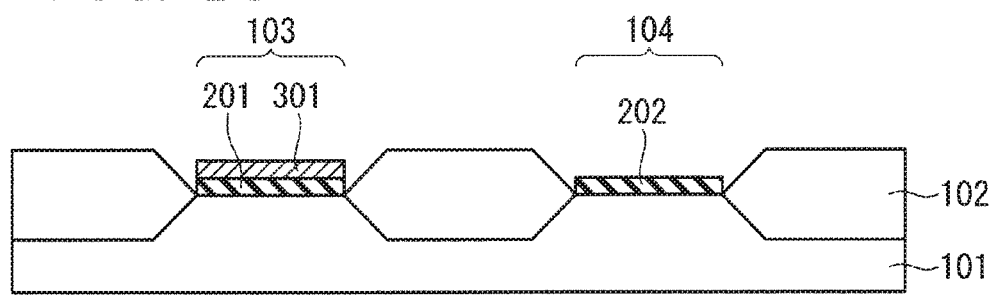
FIG. 26 is a cross-sectional view for describing a step in a method for manufacturing a semiconductor device according to a third embodiment.
Figure 27:
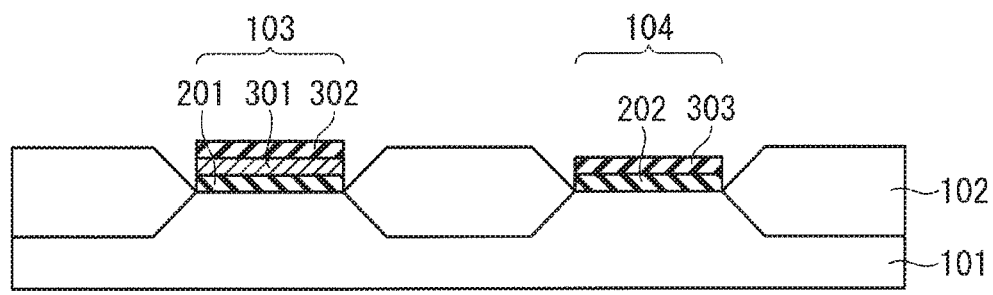
FIG. 27 is a cross-sectional view for describing a step in the method for manufacturing the semiconductor device according to the third embodiment.
Figure 28:
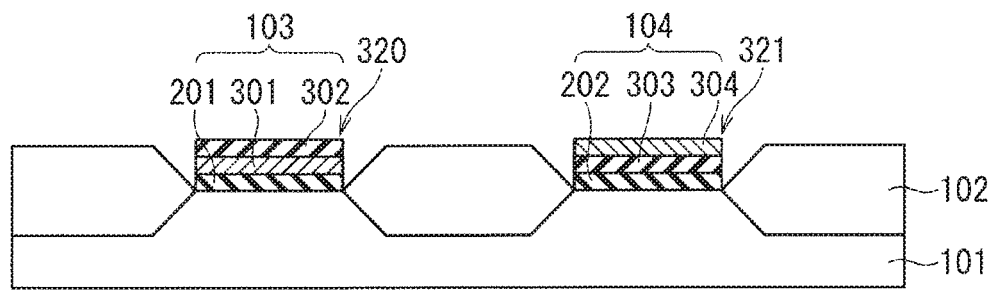
FIG. 28 is a cross-sectional view for describing a step in the method for manufacturing the semiconductor device according to the third embodiment.

FIGS. 26 to 28 are cross-sectional views of the configuration of a semiconductor device for describing steps in the manufacture method according to the third embodiment. Identical or similar components between the manufacture method according to the third embodiment and the aforementioned manufacture methods are denoted by the same reference signs. Mainly described are components different between these methods.

First, performed are the same steps as the steps in FIGS. 21 and 22 in the manufacture method according to the second embodiment. After the step in FIG. 22, a mask (not shown), such as a resist, is formed through, for instance, photolithography. Then, as illustrated in FIG. 26, a polysilicon electrode 301 is formed onto the oxide film 201 in the low-voltage active area 103.

Then, as illustrated in FIG. 27, an oxide film 302 is formed onto the polysilicon electrode 301 in the low-voltage active area 103; in addition, an oxide film 303 is formed onto the oxide film 202 in the high-voltage active area 104.

Subsequently, a mask (not shown), such as a resist, is formed through, for instance, photolithography. Then, as illustrated in FIG. 28, a polysilicon electrode 304 is formed onto the oxide film 303 in the high-voltage active area 104. Through these steps, formed in the low-voltage active area 103 is a thin gate oxide film 320 including the oxide film 201; in addition, formed in the high-voltage active area 104 is a thick gate oxide film 321 including the oxide films 202 and 303.

<Gist of Third Embodiment>

In the manufacture method according to the third embodiment, a target to be over-etched through wet etching is only the underlay oxide film 105, which is relatively thin. Consequently, this manufacture method achieves a more reduced over-etch degree than the resist mask flow, which removes the relatively thick oxide film 107 in FIG. 3, thereby preventing the film loss in the LOCOS 102 near the low-voltage active area 103. Further, no nitride film cover is formed. Hence, no nitrogen (N) diffuses throughout the silicon substrate 101. This prevents the thin film portion 146 in FIG. 11.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 101 silicon substrate, 103 low-voltage active area, 104 high-voltage active area, 105, 106 underlay oxide film, 131 nitride film cover, 132, 133, 152, 154, 155 oxide film, 134, 153 resist, 151 sacrificial oxide film, 160 thin gate oxide film, 161 thick gate oxide film.

The invention claimed is:

1. A method for manufacturing a semiconductor device including a first gate oxide film and a second gate oxide film thicker than the first gate oxide film, the method comprising:

preparing a silicon substrate having a main surface on which a first area and a second area are defined, the silicon substrate including a first oxide film and a second oxide film respectively disposed on the main surface in the first area and on the main surface in the second area;

forming a nitride film onto the first oxide film in the first area using a first mask;

after forming the nitride film, removing the second oxide film from the second area;

after removing the second oxide film, forming a third oxide film onto the nitride film in the first area and forming a fourth oxide film onto the main surface in the second area;

removing the third oxide film, the nitride film, and the first oxide film from the first area using a second mask;

after removing the third oxide film, the nitride film, and the first oxide film, forming a fifth oxide film onto the main surface in the first area;

removing the fifth oxide film from the first area using a third mask; and after removing the fifth oxide film, forming a sixth oxide film onto the main surface in the first area, wherein the first gate oxide film includes the sixth oxide film, and the second gate oxide film includes the fourth oxide film.

2. The method for manufacturing a semiconductor device according to claim 1, comprising forming the fifth oxide film onto the main surface in the first area and forming a seventh oxide film onto the fourth oxide film in the second area, wherein the second gate oxide film further includes the seventh oxide film.

3. The method for manufacturing a semiconductor device according to claim 2, comprising forming the sixth oxide film onto the main surface in the first area and forming an eighth oxide film onto the seventh oxide film in the second area, wherein the second gate oxide film further includes the eighth oxide film.

4. The method for manufacturing a semiconductor device according to claim 1, wherein the first gate oxide film has a thickness of 100 Å or less.

5. The method for manufacturing a semiconductor device according to claim 1, wherein the fifth oxide film has a thickness of 100 Å or more.

* * * * *